US007659793B2

(12) United States Patent
Fukushima

(10) Patent No.: US 7,659,793 B2
(45) Date of Patent: Feb. 9, 2010

(54) ANTENNA DEVICE INCLUDING A HIGH FREQUENCY CIRCUIT, A REACTANCE CIRCUIT AND FIRST AND SECOND GROUND SECTIONS

(75) Inventor: Susumu Fukushima, Osaka (JP)

(73) Assignee: Panasonic Corporation, Osaka (JP)

( * ) Notice: Subject to any disclaimer, the term of this patent is extended or adjusted under 35 U.S.C. 154(b) by 419 days.

(21) Appl. No.: 10/586,069

(22) PCT Filed: Nov. 24, 2005

(86) PCT No.: PCT/JP2005/021532

§ 371 (c)(1), (2), (4) Date: Jul. 14, 2006

(87) PCT Pub. No.: WO2006/057275

PCT Pub. Date: Jun. 1, 2006

(65) Prior Publication Data

US 2008/0238802 A1 Oct. 2, 2008

(30) Foreign Application Priority Data

Nov. 29, 2004 (JP) ............................ 2004-343490
Oct. 21, 2005 (JP) ............................ 2005-306908

(51) Int. Cl.
*H04B 3/04* (2006.01)
*H03G 11/04* (2006.01)

(52) U.S. Cl. ................. 333/17.1; 455/575.5; 455/575.7

(58) Field of Classification Search ................ 333/17.1; 343/700 MS, 744, 745, 749, 750, 841, 846, 343/848, 849; 455/575.5, 575.7
See application file for complete search history.

(56) References Cited

U.S. PATENT DOCUMENTS 5,764,190 A * 6/1998 Murch et al. ................ 343/702
6,002,367 A * 12/1999 Engblom et al. ...... 343/700 MS
6,314,273 B1 * 11/2001 Matsuda ...................... 455/73
6,326,919 B1 * 12/2001 Diximus et al. ....... 343/700 MS
6,407,719 B1 6/2002 Ohira et al.
7,199,762 B2 * 4/2007 Liu et al. .................... 343/702
7,269,440 B2 * 9/2007 Ueda ....................... 455/552.1
2003/0137451 A1 7/2003 Cheng et al.

FOREIGN PATENT DOCUMENTS

EP 1 052 723 A2 11/2000

(Continued)

OTHER PUBLICATIONS

Supplementary European Search Report for EP 05 80 9213, dated Oct. 25, 2007.

(Continued)

*Primary Examiner*—Robert Pascal
*Assistant Examiner*—Kimberly E Glenn
(74) *Attorney, Agent, or Firm*—RatnerPrestia

(57) ABSTRACT

An antenna device includes an antenna element, a high-frequency circuit connected to the antenna element, a first ground section connected to the high-frequency circuit, a reactance circuit connected to the first ground section, and a second ground section connected to the reactance circuit. Employing the structure above allows the antenna device to have a compact body and to easily control antenna characteristics, such as radiation characteristics and input impedance characteristics.

19 Claims, 18 Drawing Sheets

FOREIGN PATENT DOCUMENTS

| | | | |
|---|---|---|---|
| EP | 1 109 250 | A1 | 6/2001 |
| EP | 1 211 750 | A2 | 6/2002 |
| JP | 8-222928 | A | 8/1996 |
| JP | 2001-024431 | | 1/2001 |
| JP | 2001-326514 | | 11/2001 |
| JP | 2005-057664 | | 3/2005 |
| JP | 2005-175902 | | 6/2005 |
| JP | 2005-340887 | | 12/2005 |
| JP | 2006-014128 | | 1/2006 |
| WO | WO 03/023900 | A1 | 3/2003 |

OTHER PUBLICATIONS

International Search Report for corresponding International Application No. PCT/JP2005/021532 dated Mar. 14, 2006.

* cited by examiner

ANTENNA DEVICE INCLUDING A HIGH FREQUENCY CIRCUIT, A REACTANCE CIRCUIT AND FIRST AND SECOND GROUND SECTIONS

This application is a U.S. National Phase Application of PCT International Application No. PCT/JP2005/021532 filed Nov. 24, 2005.

TECHNICAL FIELD

The present invention relates to an antenna device capable of controlling directivity thereof, which is suitable for a transmitter-receiver.

BACKGROUND ART

A conventional antenna device contains a plurality of antenna elements, and a phase-shifter and an amplifier are connected just below each of the antenna elements. Proper control of phase-shifters and amplifiers allows an antenna device to have desired directivity. Such a conventional structure is disclosed, for example, in Japanese Patent Unexamined Publication No. 2001-024431. FIG. 35 and FIG. 36 show an antenna device in which the directivity can be controlled by a simple circuit structure.

The antenna device shown in FIGS. 35 and 36 contains radiating element 101, and at least one parasitic element 102 so as to keep an interval from radiating element 101. Radiating element 101 receives a radio-wave signal, whereas parasitic element 102 does not receive the radio-wave signal. Variable reactance element 103 is connected to parasitic element 102. Reactance value Xn of variable reactance element 103 is changed according to data obtained by transmitting/receiving circuit 104, whereby directivity of the antenna device can be controlled.

Such structured conventional antenna device can control directivity with high accuracy. The structure, however, due to the needs for a plurality of radiation elements 101 and a plurality of parasitic elements 102, has a difficulty in reducing the size of the device. Besides, a complicated controller is required to control a plurality of variable reactance elements 103.

SUMMARY OF THE INVENTION

The antenna device of the present invention includes an antenna element, a high-frequency circuit connected to the antenna element, a first ground section connected to the high-frequency circuit, a reactance circuit connected to the first ground section, and a second ground section connected to the reactance circuit. The structure above allows the antenna device to be compact, at the same time, allows radiation characteristics and input impedance characteristics to be simply controlled.

REFERENCE MARKS IN THE DRAWINGS

Figure 1:
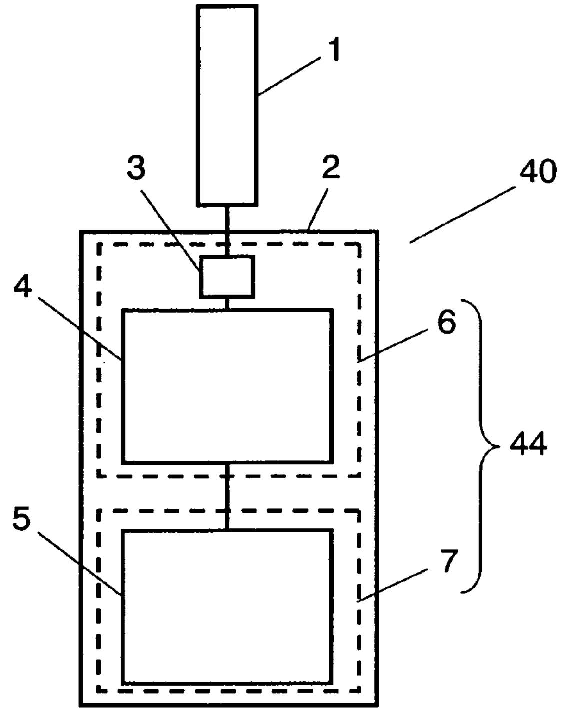
FIG. 1 is a top view of an antenna device of a first exemplary embodiment of the present invention.

1 antenna element
2 high-frequency circuit board
3, 3C matching circuit
4, 4B, 4C, 4D high-frequency circuit
5 base band processing circuit
6 first ground section
6A fifth ground section
7 second ground section
7A sixth ground section
8, 8D, 8E, 8F, 8G 8H, 8L, 8M reactance circuit (reactance element)
9, 9B, 9C, 9D coaxial line (feeder line)
10 shield line
11 signal line
12 monopole antenna
13, 13D ground housing
14, 14C double resonance point
15 switch
16 filter
17 low-noise amplifier
18 coupler
19 receiving power detecting circuit
20 demodulator
21 third ground section
21A seventh ground section
22 first high-frequency circuit board
23 second high-frequency circuit board
24 reactance-value control circuit
25 first power supply circuit
26 second power supply circuit
27 regulator
28 first shield line
29 second shield line
30 first signal line
31 second signal line
40, 40A, 40B, 40C, 40D antenna device
41 transmitter-receiver
42 fourth ground section
44, 44A, 44B, 44D, 44E ground section
45, 45B, 45C, 45D antenna model
46, 46B, 46C impedance characteristics
47, 47E inductor element
48 capacitor element
49 variable capacitance diode element
50 resistance element
51A, 51B, 51C, 51D radiation pattern
52A, 52B, 52C, 52D impedance characteristics
53 first coaxial line
54 second coaxial line
55 VSWR characteristics
101 radiating element
102 parasitic element
103 variable reactance element
104 transmitting/receiving circuit

DETAILED DESCRIPTION OF THE PREFERRED EMBODIMENTS

Hereinafter exemplary embodiments of the present invention is described with reference to drawings.

First Exemplary Embodiment

Figure 2:
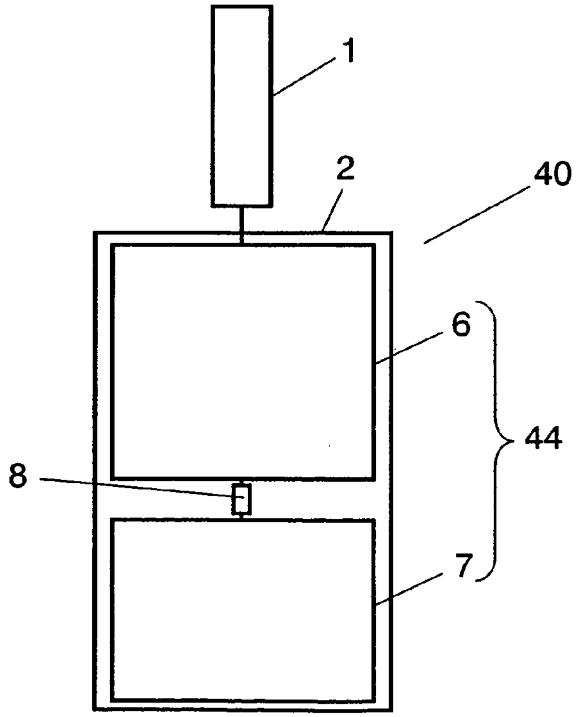
FIG. 2 is a bottom view of the antenna device shown in FIG. 1.

FIG. 1 is a top view of an antenna device of a first exemplary embodiment of the present invention. FIG. 2 is a bottom view of the antenna device shown in FIG. 1.

In FIGS. 1 and 2, first ground section 6 (hereinafter referred to as ground 6) and second ground section 7 (hereinafter, ground 7) are formed on a lower surface of high-frequency board 2 (hereinafter, board 2). Via reactance circuit 8 (hereinafter, circuit 8), ground 6 and ground 7 are connected together. Ground 6 and ground 7 constitute ground section 44.

Antenna element 1 (hereinafter, element 1) is a conductive plate made of conductive material such as copper. One end of element 1 is connected to matching circuit 3 (hereinafter, circuit 3). Circuit 3 and high-frequency circuit 4 (hereinafter, circuit 4) are formed on an upper surface of board 2 on a back side of ground 6. Ground 6 and circuit 4 has DC- or AC-coupling. Circuit 4 is connected to circuit 3.

Base band processing circuit 5 (hereinafter, circuit 5) is formed on the upper surface of board 2 on a back side of ground 7. Circuit 5 is connected to circuit 4.

Although element 1 of FIG. 1 is a conductive plate, it is not limited thereto; element 1 may be a monopole antenna, helical antenna, or the like. Element 1 may be an inverted F-shape antenna, inverted L-shaped antenna, or the like, which is located at an upper portion than ground 6.

In the structure above, element 1, ground 6, and ground 7 carry electric current that contributes to radiation, so that element 1, ground 6 and ground 7 function as antenna device 40.

Selecting different reactance values of circuit 8 causes changes in distribution of electric current in ground 6 and ground 7. This causes not only changes in radiation patterns of antenna device 40, but also changes in input impedance fed into element 1.

The reactance value of circuit 8 is controlled according to desired directivity of antenna device 40. Antenna device 40 thus obtains optimal directivity. Besides, circuit 8 functions a part of circuit 3, expanding the scope of selection of impedance matching of element 1, and at the same time, offering impedance matching of element 1 with ease.

Circuit 8 can be differently positioned to ground 6 and ground 7. The positioning change varies the distribution of electric current in ground 6 and ground 7, allowing antenna device 40 to have a desired radiation pattern and desired impedance characteristics.

With consideration given to simplicity of circuit design, an analog circuit and a digital circuit are separately disposed on board 2: analog circuit 4 is above ground 6, and digital circuit 5 is above ground 7. The circuit design is not limited thereto; a part of circuit 4 may be disposed above ground 7, or a part of circuit 5 may be disposed above ground 6.

Second Exemplary Embodiment

Figure 3:
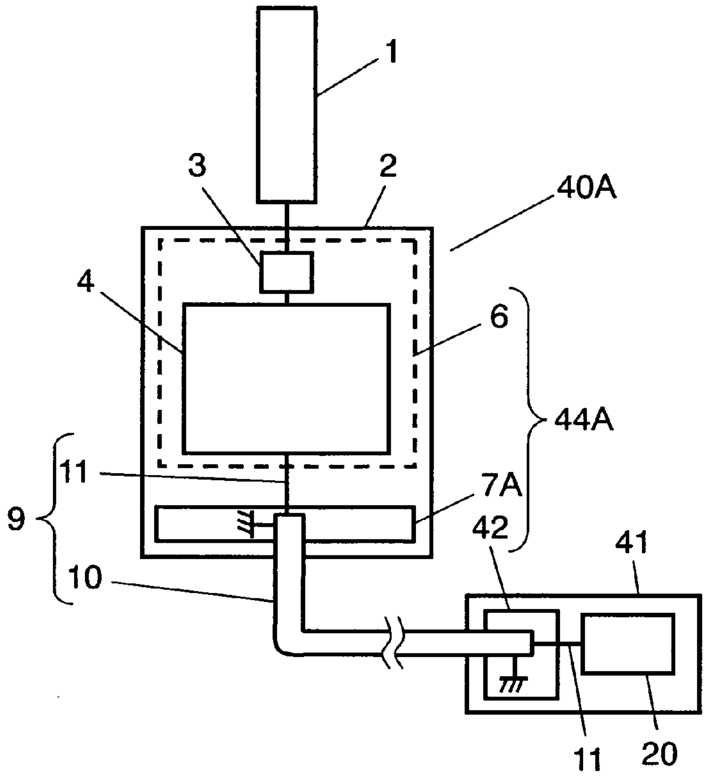
FIG. 3 is a top view of an antenna device of a second exemplary embodiment of the present invention.
Figure 4:
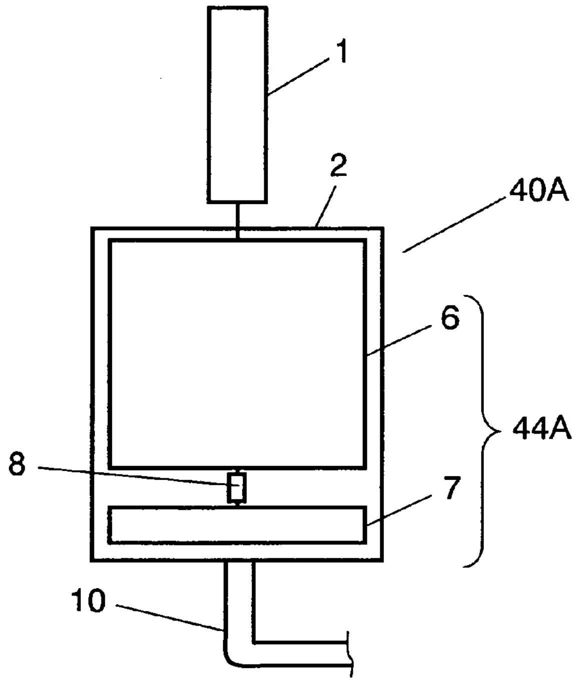
FIG. 4 is a bottom view of the antenna device shown in FIG. 3.

FIG. 3 is a top view of an antenna device of a second exemplary embodiment of the present invention. FIG. 4 is a bottom view of the antenna device shown in FIG. 3. Like parts have similar reference marks as in the structure of the first exemplary embodiment, and the explanation thereof will be omitted.

In FIGS. 3 and 4, coaxial line 9 as a feeder line is formed of shield line 10 and signal line 11 that is covered with shield line 10. One end of signal line 11 is connected to high-frequency circuit 4, and the other end is connected to transmitter-receiver 41. Shield line 10 is connected to sixth ground section 7A (hereinafter referred to as ground 7A) that is formed on the upper surface of board 2. Ground 7 and ground 7A are connected via a through-hole (not shown) or a via-hole (not shown) formed in board 2. The structure of the second exemplary embodiment differs from that of the first exemplary embodiment in the respects above. Ground 44A is formed of ground 6, ground 7, and ground 7A Transmitter-receiver 41 contains demodulator 20 and other components.

The structure above allows ground 44A to embrace fourth ground section 42 (hereinafter, ground 42) of transmitter-receiver 41 to which shield line 10 is connected. Specifically, ground 44A extends its size by the total of ground 6 (the first ground section), ground 7 (the second ground section), ground 42 (the fourth ground section), and ground 7A (the sixth ground section). Ground 44A carries a large amount of current that contributes to radiation of antenna device 40A. The antenna characteristics of antenna device 40A largely depend on the size of ground 44A and distribution of electric current in it. Changing reactance values of circuit 8 causes changes in the distribution of the current in ground 44A, which changes the radiation pattern of antenna device 40A.

Determining coaxial line 9 so as to have a different shape or length changes ground 44A in size, developing double resonance that depends on an electrical length of ground 44A in impedance characteristics of antenna device 40A.

Hereinafter, description on aforementioned double resonance is given with reference to FIG. 5 through FIG. 12.

Figure 5:
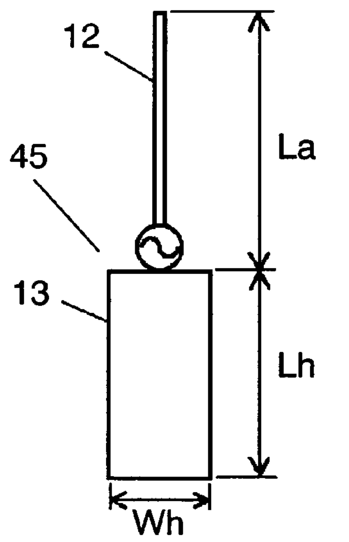
FIG. 5 shows an analytical model of an antenna device.
Figure 7:
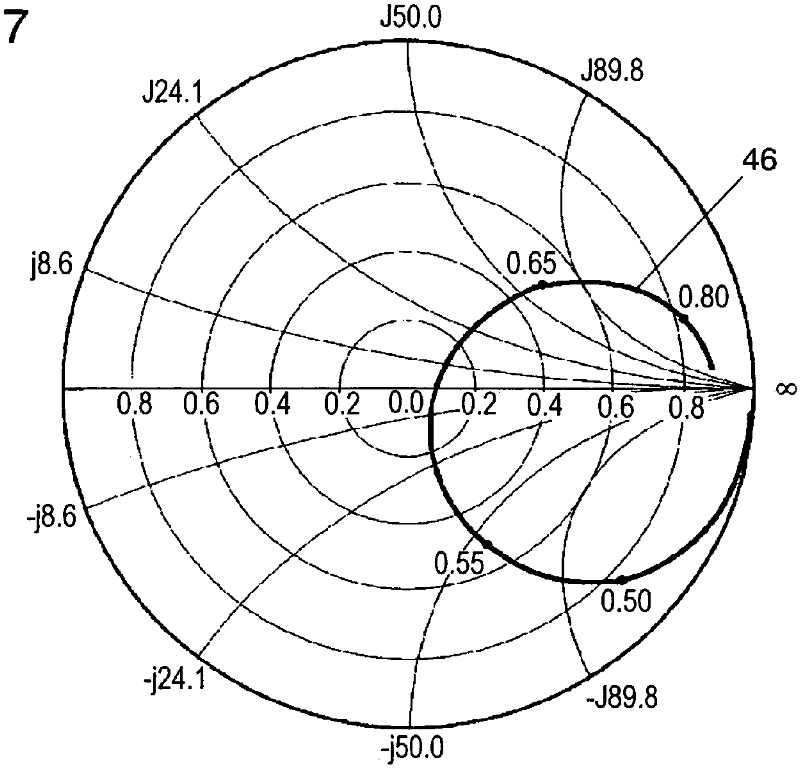
FIG. 7 shows impedance characteristics of the analytical model of the antenna device shown in FIG. 5.

FIG. 5 shows antenna model 45 (hereinafter, model 45) in which monopole antenna 12 (hereinafter, antenna 12) with length La of 120 mm is connected to ground housing 13. Antenna 12 serves as antenna element 1. Ground housing 13 measures 100 mm in length Lh and 30 mm in width Wh. FIG. 7 shows impedance characteristics 46 of model 45.

Figure 6:
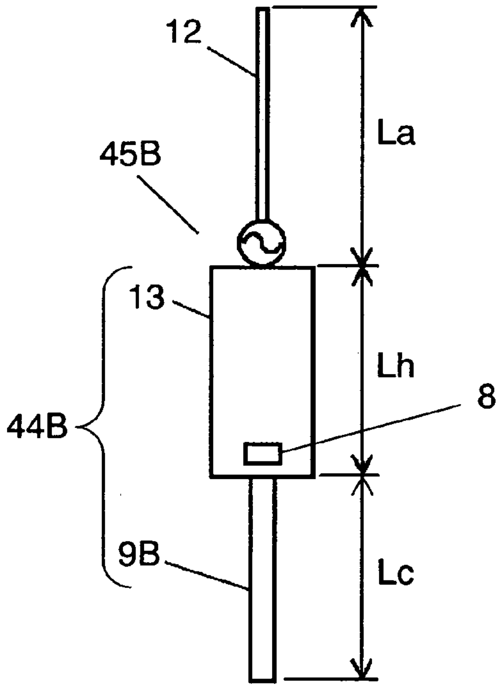
FIG. 6 shows an analytical model of an antenna device.
Figure 8:
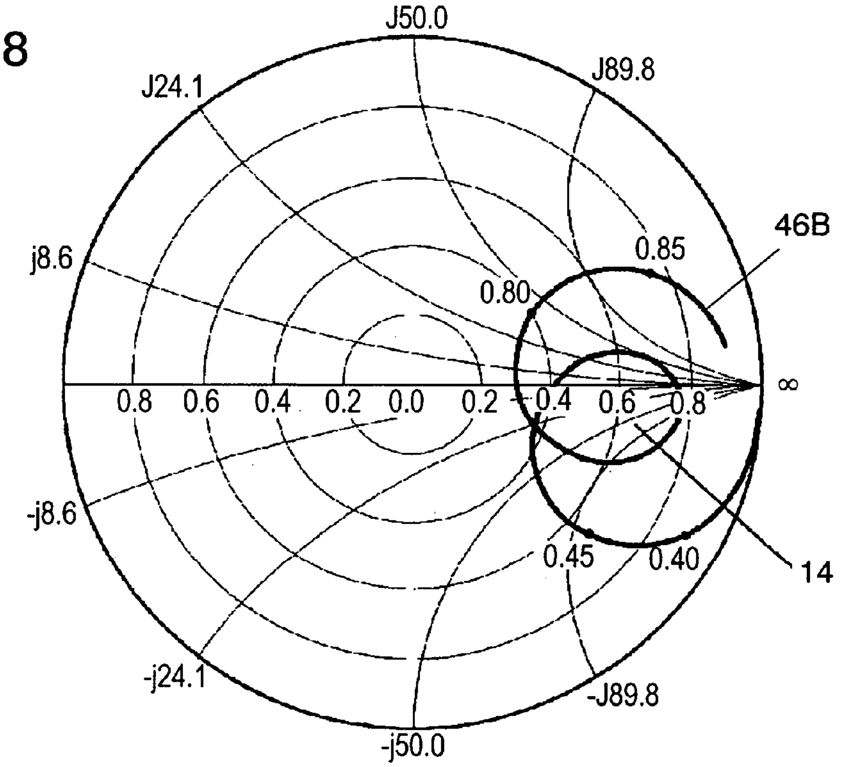
FIG. 8 shows impedance characteristics of the analytical model of the antenna device shown in FIG. 6.

On the other hand, FIG. 6 shows antenna model 45B (hereinafter, model 45B) in which coaxial line 9B with length Lc of 100 mm is connected to ground housing 13. Ground housing 13 and coaxial line 9B constitute grand 44B. FIG. 8 shows impedance characteristics 46B of model 45B.

Impedance characteristics 46B (FIG. 8) differs from impedance characteristics 46 (FIG. 7) in having double resonance point 14. Double resonance point 14 develops at a frequency of 750 MHz whose half-wavelength is roughly equal to 200 mm, which is the total length of ground housing 13 (Lh) and coaxial line 9 (Lc).

A frequency ($F_0$) at which a double resonance point occurs with the use of a coaxial line having a certain length is obtained by the expression (1) below;

$$F_0 = \frac{C_0}{2*L/N}, \tag{1}$$

where L represents a total length of coaxial line 9B and ground housing 13, $F_0$ represents a frequency at which double resonance point 14 develops, $C_0$ represents the speed of light. N takes a positive integer.

Impedance-matching with consideration given to double resonance point 14 additionally provides model 45B with broadband characteristics.

Figure 9:
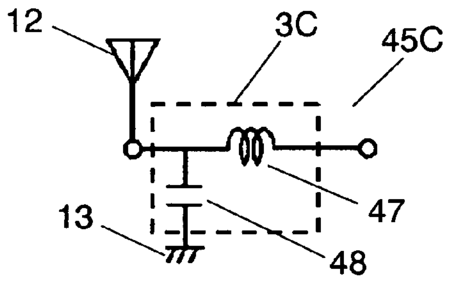
FIG. 9 is a circuit diagram illustrating the circuit structure of an analytical model of an antenna device.
Figure 10:
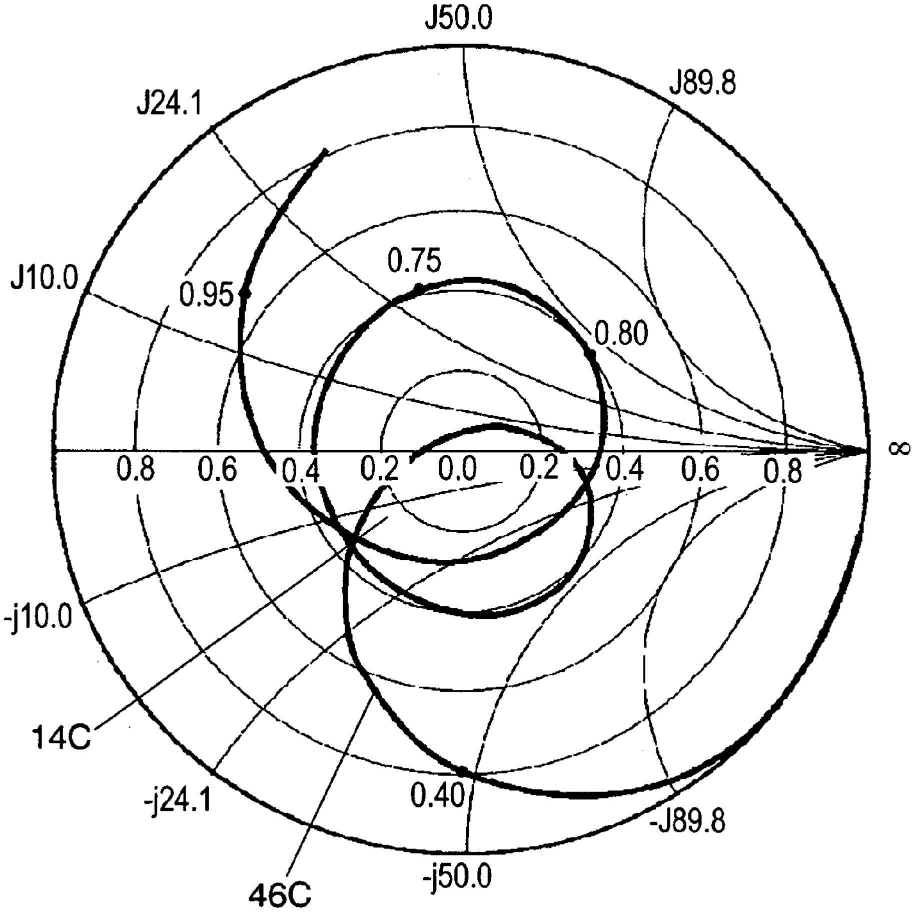
FIG. 10 shows impedance characteristics of the analytical model of the antenna device shown in FIG. 9.
Figure 11:
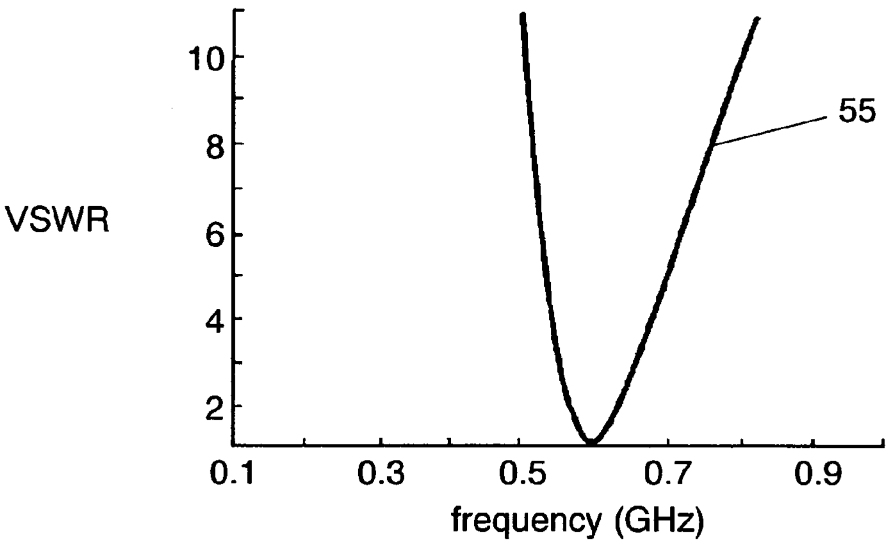
FIG. 11 shows VSWR (voltage standing wave ratio) characteristics of the analytical model of the antenna device shown in FIG. 5.
Figure 12:
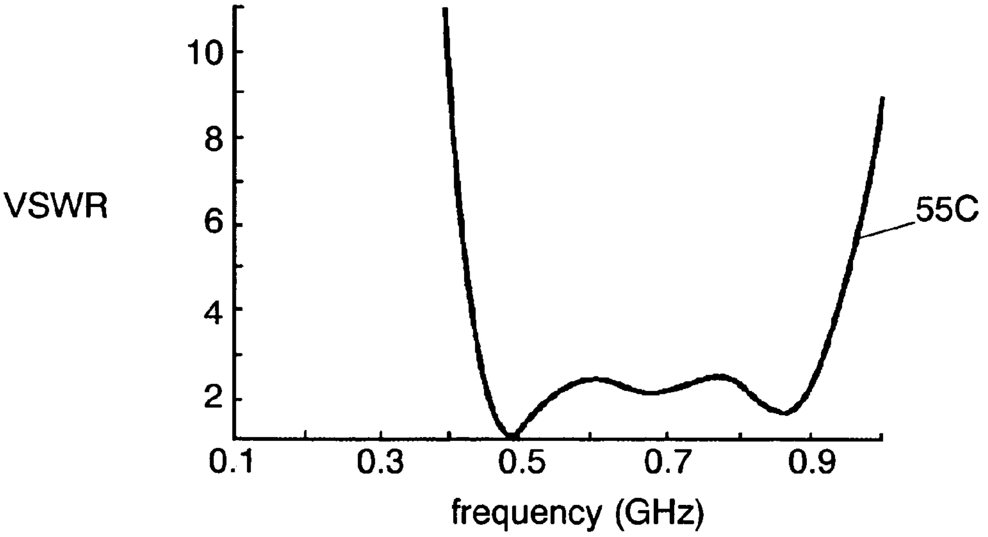
FIG. 12 shows VSWR characteristics of the analytical model of the antenna device shown in FIG. 6.

FIG. 9 shows antenna model 45C (hereinafter, model 45C) having the structure where matching circuit 3C (hereinafter, circuit 3C) is disposed just under antenna 12 of model 45B. Circuit 3C is formed of inductor element 47 including a coil element or the like, and capacitor element 48. For example, inductor element 47 has a coefficient of induction of 19 nH, and capacitor element 48 has an electric capacitance of 2 pF. FIG. 10 shows impedance characteristics 46C of model 45C. In model 45C, as shown in FIG. 10, the matching point of double resonance point 14C shifts close to 50 Ω, which contributes to a broaden bandwidth; compared to VSWR characteristics 55 of model 45 (FIG. 11), VSWR characteristics 55C of model 45C (FIG. 12) has a broader bandwidth. When the two models above are compared about bandwidth in a range of VSWR<3, model 45 obtains 100 MHzBW (bandwidth), whereas model 45C achieves 450 MHzBW. That is, model 45C acquires a bandwidth 4.5 times broader than model 45.

Antenna device 40A described in the second embodiment works on an improved wideband antenna and has drastically selectable radiation patterns at the same time. The advantages above allow antenna device 40A to be particularly suitable for a TV antenna for mobile communications.

Although no component is mounted on ground 7 and ground 7A shown in FIG. 3 and FIG. 4, a structure having a component disposed thereon for reduction in size of antenna device 40A is also effective.

Figure 13:
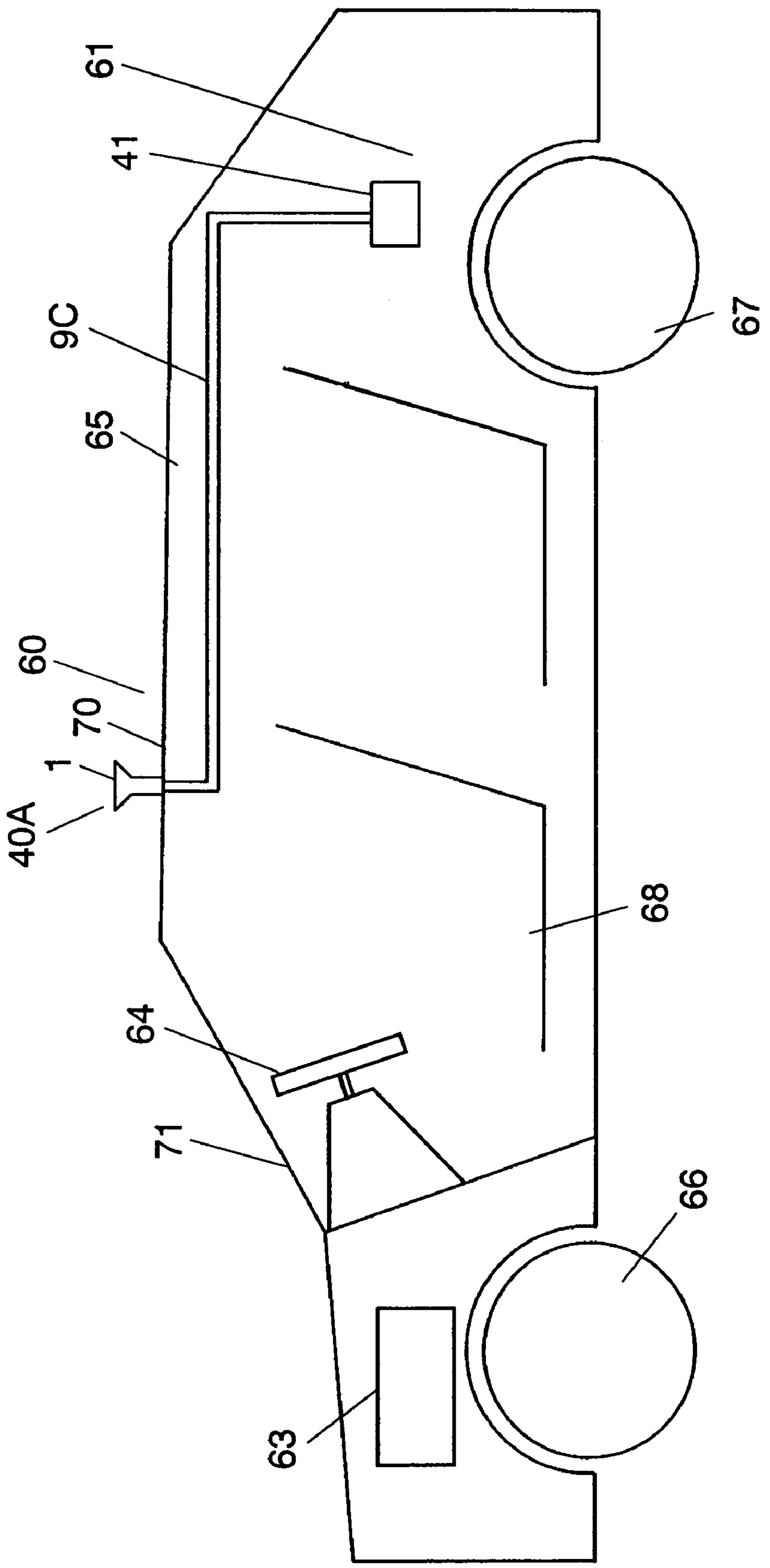
FIG. 13 is a section view schematically showing a vehicle having the antenna device shown in FIG. 3.

FIG. 13 is a section view schematically showing a vehicle equipped with antenna device 40A as an on-vehicle antenna.

Vehicle 60 of FIG. 13 has body 65, seat 68, driving section 63, steering 64, front wheel 66, and rear wheel 67. Seat 68 and steering 64 are disposed in the interior room of body 65, and driving section 63 is disposed in the engine room of body 65. Steering 64 operates front wheel 64 as a steering wheel of the vehicle. Having the engine and motor, driving section 64 drives rear wheel 67 as a driving wheel. Driving section 63 may drive front wheel 66. Front wheel 66 and rear wheel 67 hold body 65. Trunk 61 is formed in the interior of body 65 of vehicle 60.

Element 1 is attached on roof 70 or the outside of windshield 71 for good receiving conditions. Transmitter-receiver 41 is installed in an inconspicuous place, such as places inside trunk 61, under seat 68. Antenna device 40A and transmitter-receiver 41 are electrically fed from vehicle 60. Element 1 is connected to transmitter-receiver 41 via coaxial line 9C with a length of approx. 5 m. Such installed antenna device 40A is used for the on-vehicle antenna with ease. Antenna device 40A effectively works as an on-vehicle antenna, offering radiation patterns with a wide variable range and excellent receiving characteristics.

Now will be described a specific circuit structure of reactance circuit 8 used for antenna devices 40 and 40A, with reference to FIG. 14 through FIG. 18.

Each of FIGS. 14 through 18 shows a typical circuit structure of reactance circuit 8 for antenna devices 40 and 40A.

A characteristic required of circuit 8 is that circuit 8 is short-circuited when it carries direct current. Unless circuit 8 is short-circuited in the direct current flow, ground 6 or ground 7 has no power supply, and accordingly, active elements of circuit 4 and circuit 5 have no power supply also. To avoid the inconveniences, circuit 8 has to be structured in a way that inductor elements including a coil element or the like are connected in series to cause a short circuit in direct current flow.

Figure 14:
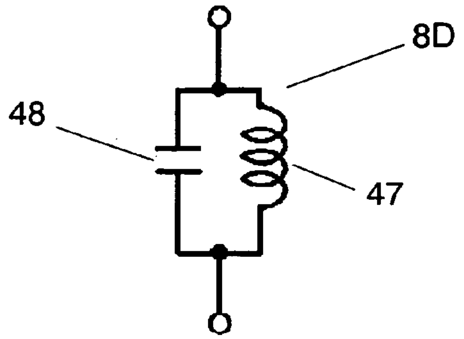
FIG. 14 is a circuit diagram illustrating a structure of a reactance circuit.

For example, providing circuit 8 with a capacitive component allows antenna 40 (40A) to have a desired radiation pattern. When circuit 8 needs to have a capacitive component, reactance circuit 8D (hereinafter, circuit 8D) should preferably be a parallel structure, as shown in FIG. 14, of inductor element 47 and capacitor element 48, because circuit 8D has a capacitive component in a frequency greater than resonance frequency $F_0$ of circuit 8D. Such structured circuit 8D has a short-circuit in direct current flow; on the other hand, has a capacitive component in a desired frequency.

Compared to circuit 8D, reactance circuit 8E (hereinafter, circuit 8E) shown in FIG. 15 has a structure where inductor element 47E is further inserted in series. That is, circuit 8E has more elements than circuit 8D. With the structure above, a desired reactance value suitable for varying frequencies can be obtained with ease.

Figure 15:
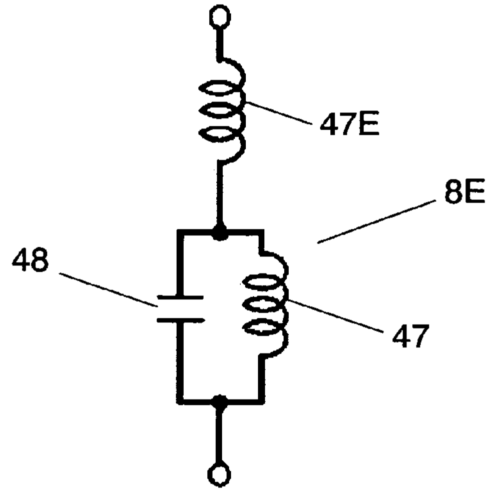
FIG. 15 is a circuit diagram illustrating another structure of a reactance circuit.

Although circuit 8E shown in FIG. 15 is formed of three elements—inductor elements 47, 47E and capacitor element 48, it is not limited thereto; circuit 8 can be formed of four or more reactance elements, as long as the structure is short-circuited in direct current flow.

Figure 16:
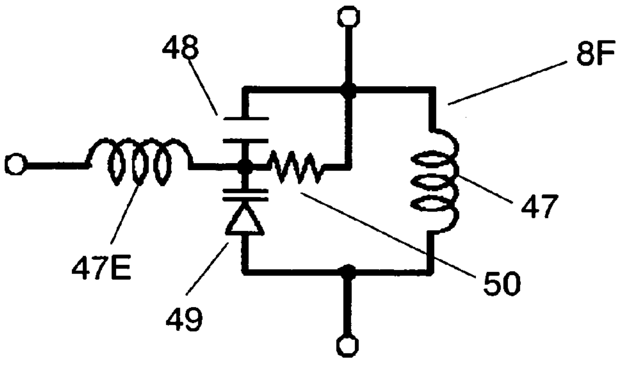
FIG. 16 is a circuit diagram illustrating still another structure of a reactance circuit.

Reactance circuit 8F (hereinafter, circuit 8F) shown in FIG. 16 has variable capacitance diode (vari-cap diode) element 49, allowing circuit 8F to have a reactance value optimally controlled with respect to time. Other than variable capacitance diode element 49, circuit 8F contains inductor elements 47, 47E, capacitor element 48, and resistance element 50.

Employing circuit 8F for antenna device 40 (40A) is effective in mobile communications. Under the circumstance, antenna device 40 (40A) selects an optimal radiation pattern according to radio wave condition that changes with time. As a result, the antenna device offers excellent receiving characteristics with consistency in mobile receiving.

Figure 17:
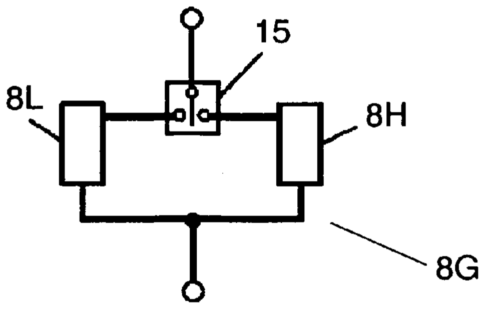
FIG. 17 is a circuit diagram illustrating yet another structure of a reactance circuit.

Reactance circuit 8G (hereinafter, circuit 8G) shown in FIG. 17 contains reactance circuit 8H and reactance circuit 8L (hereinafter, circuit 8H, circuit 8L, respectively). Circuits 8H and 8L have a structure typified by circuits 8D, 8E, and 8F shown in FIG. 14 through FIG. 16. Circuit 8G further contains switch 15. Switch 15 makes a selection between circuit 8H and circuit 8L to change a reactance value of circuit 8G, thereby switching a reactance value with ease, and expanding the range of reactance values suitable for circuit 8G. This allows antenna device 40 (40A) to have an expanded variable range of radiation pattern and an expanded controlling range of impedance.

Figure 18:
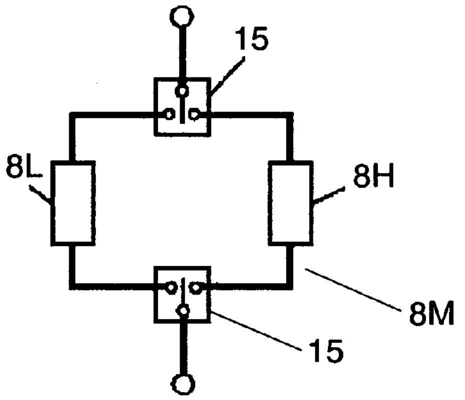
FIG. 18 is a circuit diagram illustrating another structure of a reactance circuit.

Reactance circuit 8M (hereinafter, circuit 8M) shown in FIG. 18 has a structure where another switch 15 is added to circuit 8G. The structure, where circuit 8H and circuit 8L individually work, can simplify the design of antenna device 40 (40A).

Each of circuits 8H and 8L does not necessarily require a plurality of elements; each circuit may simply contain a reactance element.

Next will be described radiation patterns of the antenna device with reference to FIG. 19 through FIG. 23.

Figure 19:
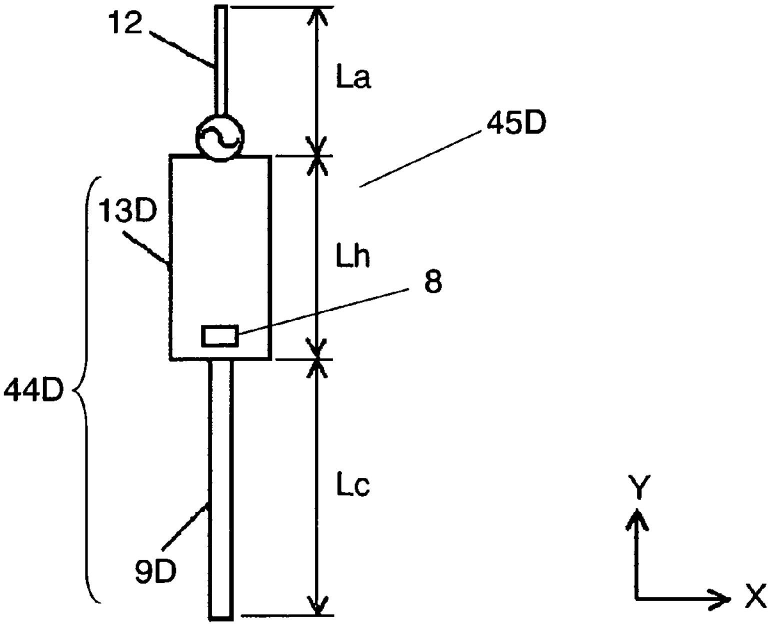
FIG. 19 shows an analytical model of an antenna device.

FIGS. 20 through 23 show changes in radiation patterns at a frequency condition of 600 MHz according to changes in reactance values of circuit 8 of antenna device 40A. FIG. 19 shows antenna model 45D (hereinafter, model 45D) used for finding radiation patterns of antenna device 40A.

Model 45D has monopole antenna 12 with length La of 120 mm as antenna element 1. Ground housing 13D, which has length Lh of 240 mm (that nearly equals to $\lambda/2$) lengthwise, is connected to antenna 12. Coaxial line 9D with length Lc of 360 mm is connected to ground housing 13D. Reactance circuit 8 is disposed at an end of ground housing 13D opposite the feeding point of antenna 12. The position of circuit 8 corresponds to the section between ground 6 and ground 7 connected with shield line 10, as shown in FIGS. 3 and 4. Ground housing 13D and coaxial line 9D constitute ground section 44D.

To effectively change the radiation patterns of antenna device 40A, circuit 8 is preferably disposed in ground section 44D at a position that bears a large amount of electric current that is generated in ground section 44D and is used for radiation. It is also preferable that the current which contributes to radiation has a distribution with a great change.

The current that contributes to radiation has a standing-wave-shaped distribution in ground section 44D. When ground section 44D has a length (in a lengthwise direction) not less than three-quarters of the wavelength of the standing wave, the distance between the feeding point of ground section 44D and a position having a loop of the standing wave is roughly given as follows: a substantial sum length of n times wavelength and a half of wavelength, (where n takes a positive integer including zero). Considering above, in model 45D, reactance circuit 8 is positioned on which a loop of the standing wave is formed.

Figure 20:
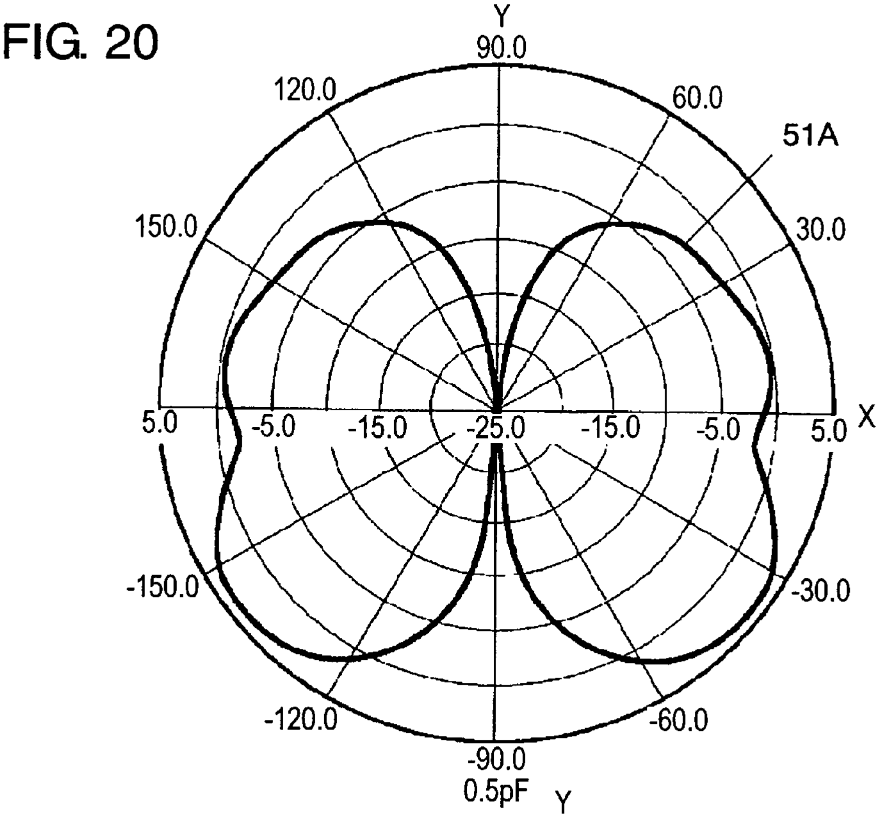
FIG. 20 shows changes in a radiation pattern of an analytical model of the antenna device shown in FIG. 19.
Figure 21:
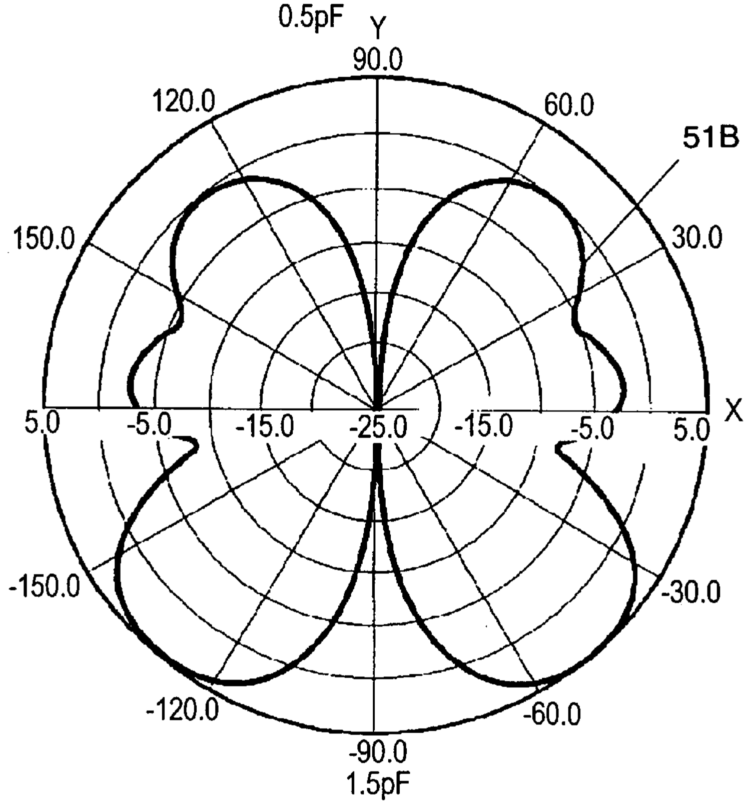
FIG. 21 shows changes in a radiation pattern of another analytical model of the antenna device shown in FIG. 19.
Figure 22:
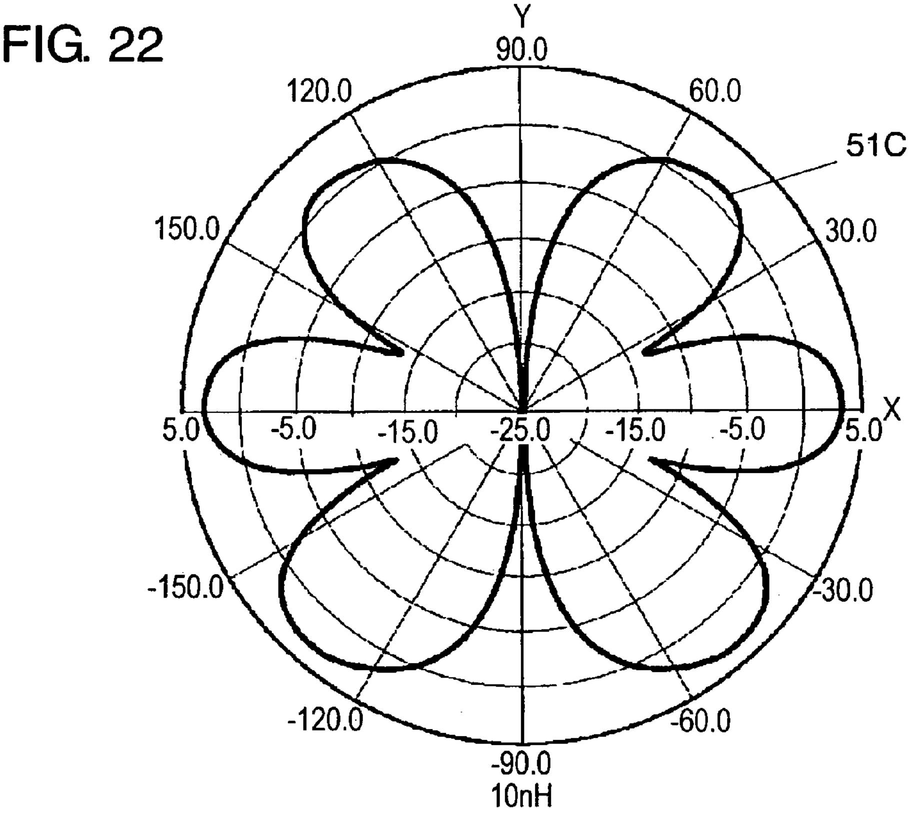
FIG. 22 shows changes in a radiation pattern of still another analytical model of the antenna device shown in FIG. 19.
Figure 23:
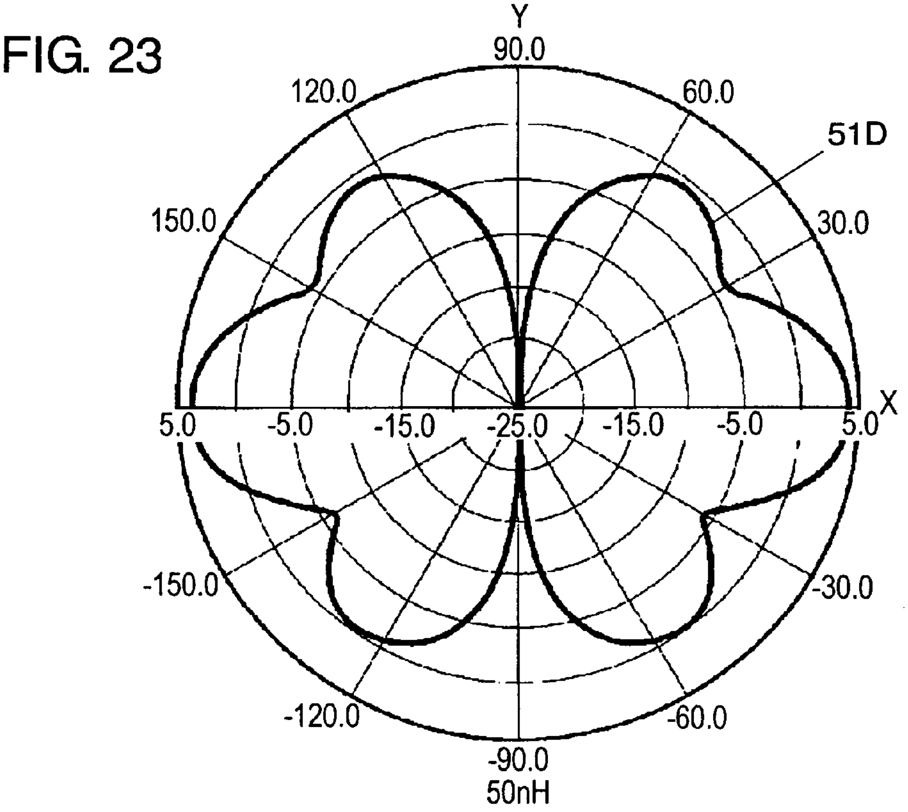
FIG. 23 shows changes in a radiation pattern of yet another analytical model of the antenna device shown in FIG. 19.

FIGS. 20 and 21 show radiation patterns 51A and 51B, respectively, of model 45D that employs a capacitor element for circuit 8. On the other hand, FIGS. 22 and 23 show radiation patterns 51C and 51D, respectively, of model 45D that employs an inductor element for circuit 8. Each of FIGS. 20 through 23 shows a radiation pattern on the x-y plane at a coordinate axis shown in FIG. 19.

Each radiation pattern shown in FIGS. 20 through 23 is obtained by model 45D that employs the following elements: a capacitor element with an electric capacitance of 0.5 pF in FIG. 20; a capacitor element with an electric capacitance of 1.5 pF in FIG. 21; an inductor element with a coefficient of induction of 10 nH in FIG. 22; and an inductor element with a coefficient of induction of 50 nH in FIG. 23.

FIGS. 20 through 23 show that radiation patterns of model 45D greatly depend on a reactance value of circuit 8. That is, an optimal radiation pattern can be selected according to the direction of coming waves (that include both of a desired wave and an undesired wave).

Next will be described input impedance characteristics of an antenna device with reference to FIG. 24 through FIG. 27.

FIGS. 24 through 27 show changes in input impedance in model 45B of antenna device 40A shown in FIG. 6 when the reactance value of circuit 8 is changed. Reactance circuit 8 is disposed on model 45B of FIG. 6 based on a theoretical calculation the same as that used in model 45D of FIG. 19.

Figure 24:
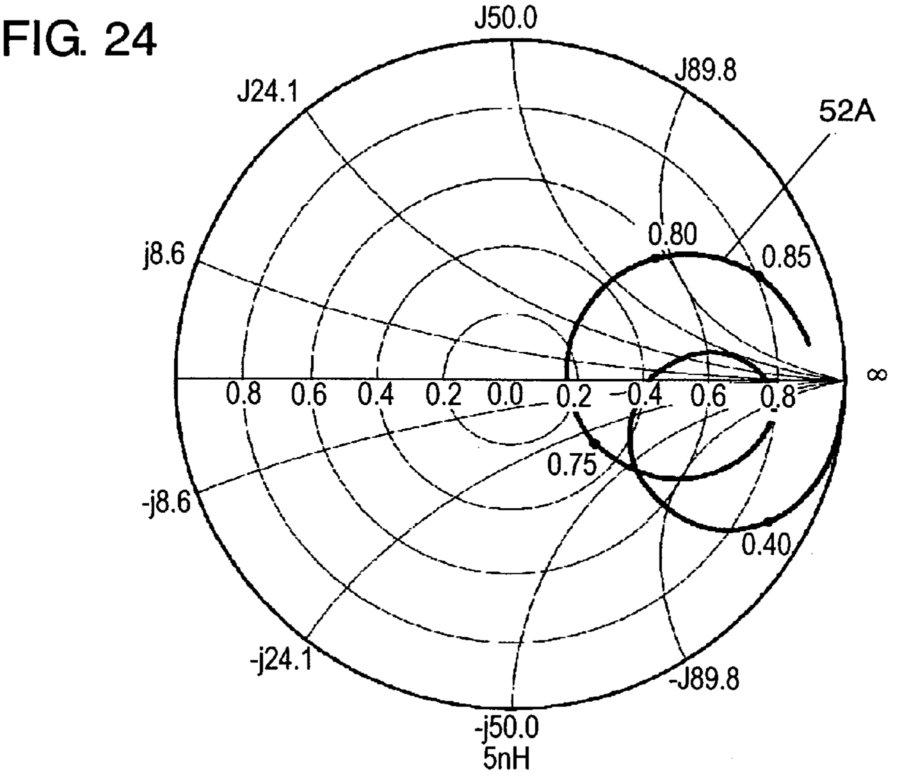
FIG. 24 shows impedance characteristics of an analytical model of the antenna device of FIG. 6.
Figure 25:
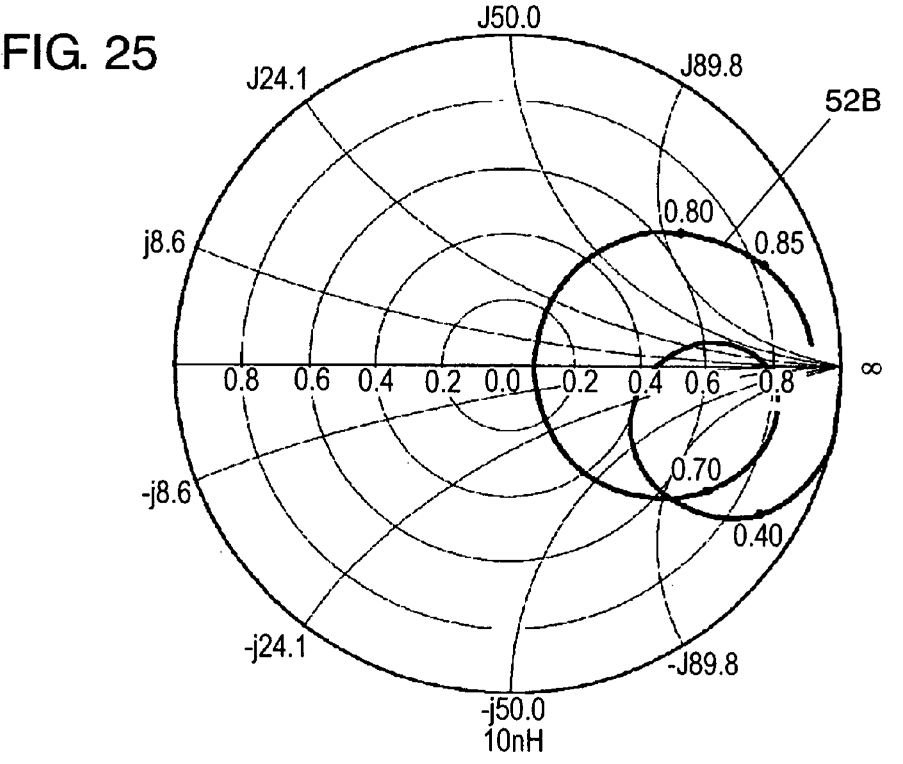
FIG. 25 shows impedance characteristics of another analytical model of the antenna device of FIG. 6.

FIGS. 24 and 25 show impedance characteristics 52A and 52B, respectively, of model 45B that employs an inductor element for circuit 8. On the other hand, FIGS. 26 and 27 show impedance characteristics 52C and 52D, respectively, of model 45B that employs a capacitor element for circuit 8.

Figure 26:
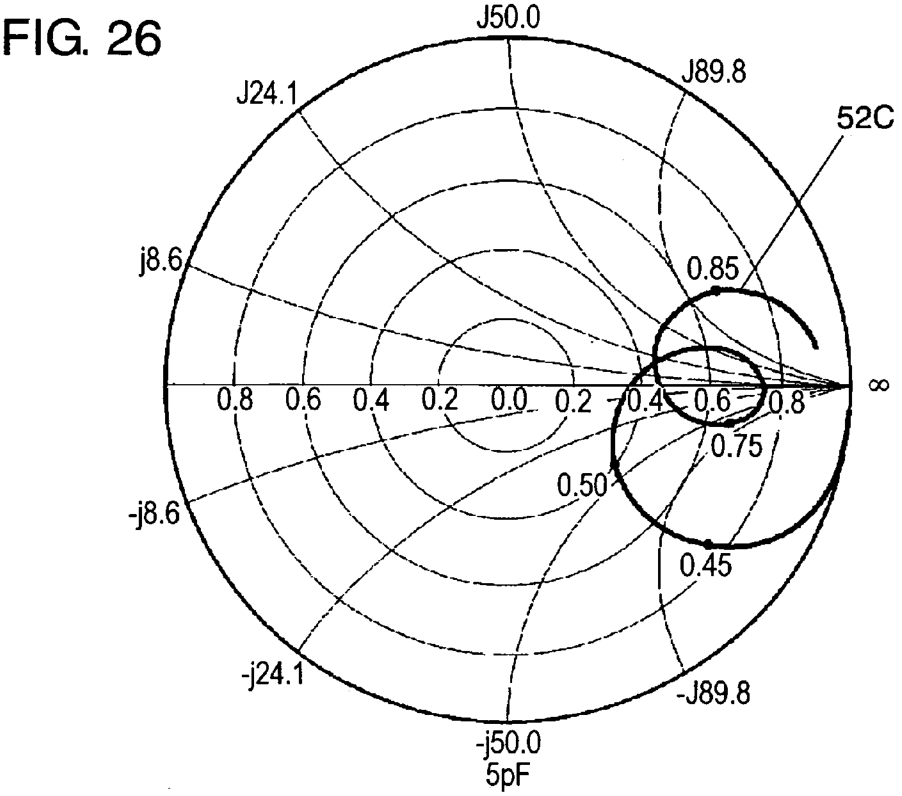
FIG. 26 shows impedance characteristics of still another analytical model of the antenna device of FIG. 6.
Figure 27:
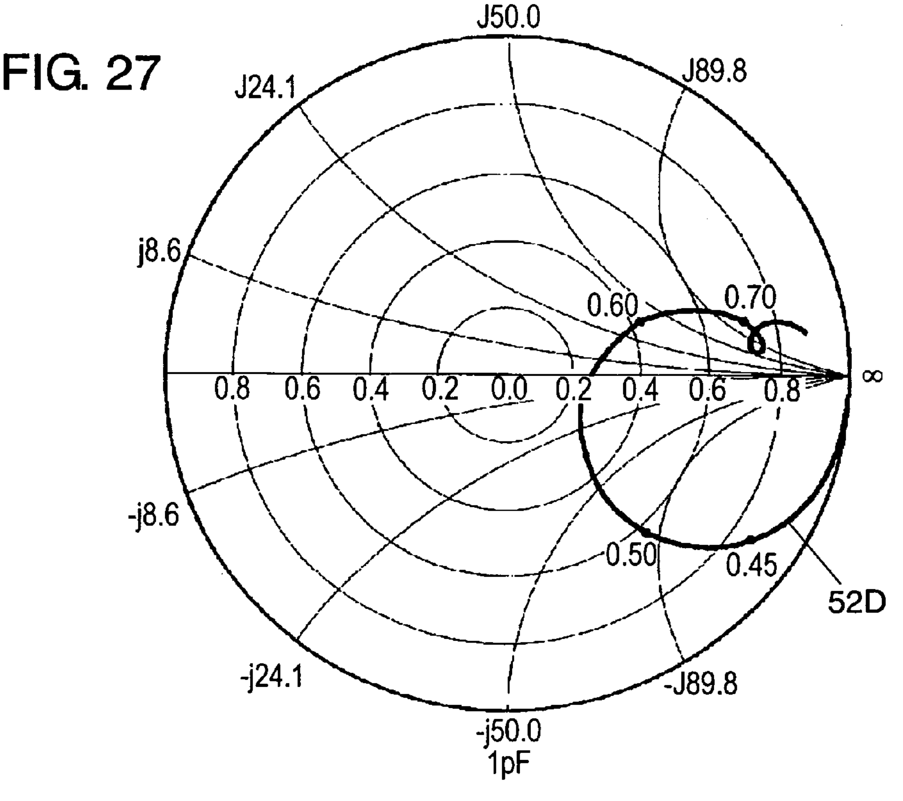
FIG. 27 shows impedance characteristics of yet another analytical model of the antenna device of FIG. 6.

Each impedance characteristic shown in FIGS. 24 through 27 is obtained by model 45B that employs the following elements: an inductor element with a coefficient of induction of 5 nH in FIG. 24; an inductor element with a coefficient of induction of 10 nH in FIG. 25; a capacitor element with an electric capacitance of 5 pF in FIG. 26; and a capacitor element with an electric capacitance of 1 pF in FIG. 27.

As is shown in FIGS. 24 through 27, changing reactance values of circuit 8 can control an input impedance of antenna device 40A. When input impedance of antenna device 40A varies under the influence of the operating environment of antenna device 40A, the impedance is controlled by the function of antenna device 40A, whereby a mismatch loss produced between antenna element 1 and circuit 4 is minimized.

Now will be described an optimal structure of a circuit block in which antenna characteristics of an antenna device can be changed and controlled, with reference to FIG. 28 and FIG. 29. Specifically, it is the circuit block capable of changing and controlling antenna characteristics as necessary so as to provide an optimal radiation pattern and input impedance according to the environment where the antenna device is used.

Figure 28:
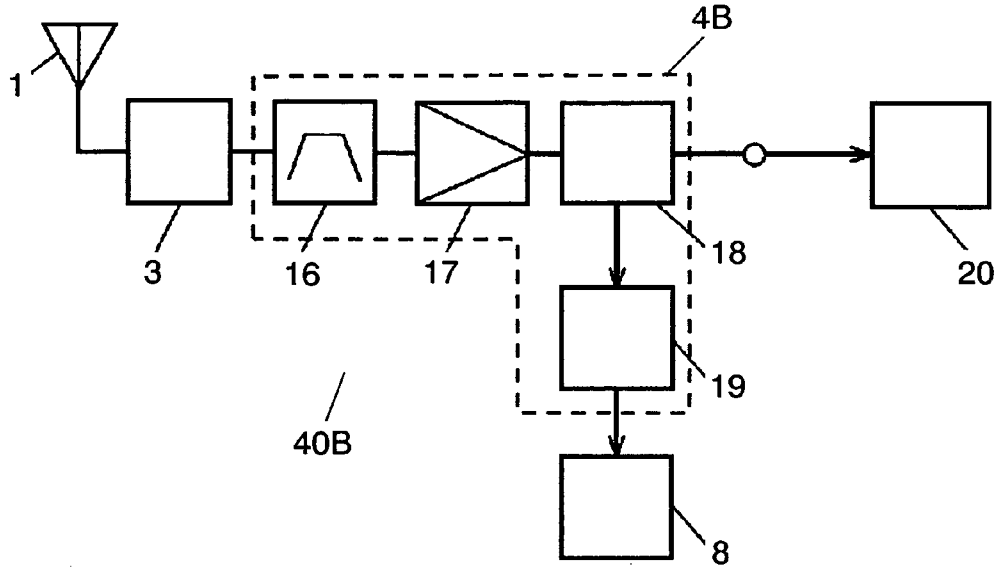
FIG. 28 shows a block diagram of a structure of the antenna device.
Figure 29:
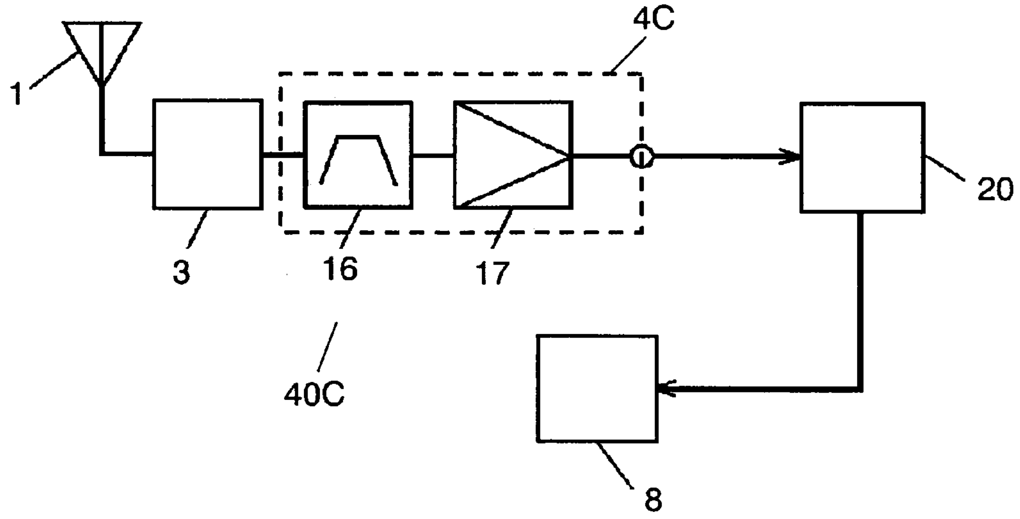
FIG. 29 shows a block diagram of another structure of the antenna device.

For sake of clarity, each of FIG. 28 and FIG. 29 shows a circuit block as a receive-only antenna device. It is also applicable to an antenna device capable of receiving and transmitting.

FIG. 28 is a circuit block diagram of antenna device 40B. Matching circuit 3 is connected directly below antenna element 1. Filter 16 is connected to matching circuit 3, and low-noise amplifier 17 (hereinafter referred to as amplifier 17) is connected to filter 16. Low-noise amplifier 17 constitutes an amplifier. An amount of the output signal from amplifier 17 is fed to receiving power detecting circuit 19 (hereinafter, circuit 19) through coupler 18. Circuit 19 monitors values of receiving power of antenna device 40B and detects the values of receiving power thereby. A reactance value of circuit 8 that is connected to circuit 19 is controlled so that the value of receiving power monitored by circuit 19 reaches maximum. The reactance value is changed by variable capacitance diode element 49 or by switching of switch 15. Variable capacitance diode element 49 and switch 15 are respectively components of circuit 8. Demodulator 20 receives receiving condition including bit error rate (BER) outputted from circuit 19. Filter 16, amplifier 17, coupler 18, and circuit 19 constitute high-frequency circuit 4B.

FIG. 29 is a circuit block diagram of antenna device 40C. Demodulator 20 receives receiving condition including an actual BER. The reactance value of circuit 8 is controlled so that the receiving condition obtained by demodulator 20 reaches an optimal level. The reactance value is changed by variable capacitance diode element 49 or by switching of switch 15. Variable capacitance diode element 49 and switch 15 are respectively components of circuit 8. Antenna characteristics including a radiation pattern and input impedance are selected and changed as necessary so that receiving condition such as BER reaches an optimal level. Filter 16 and amplifier 17 constitute high-frequency circuit 4C.

When high-frequency circuit 4 and demodulator 20 are connected via coaxial line 9, a control signal for changing the reactance value of circuit 8 to an optimal level may be added on signal line 11 as necessary. With the structure above, the wiring cables between circuit 4 and demodulator 20 can be reduced in number, whereby the installation of an antenna device is simplified.

Figure 30:
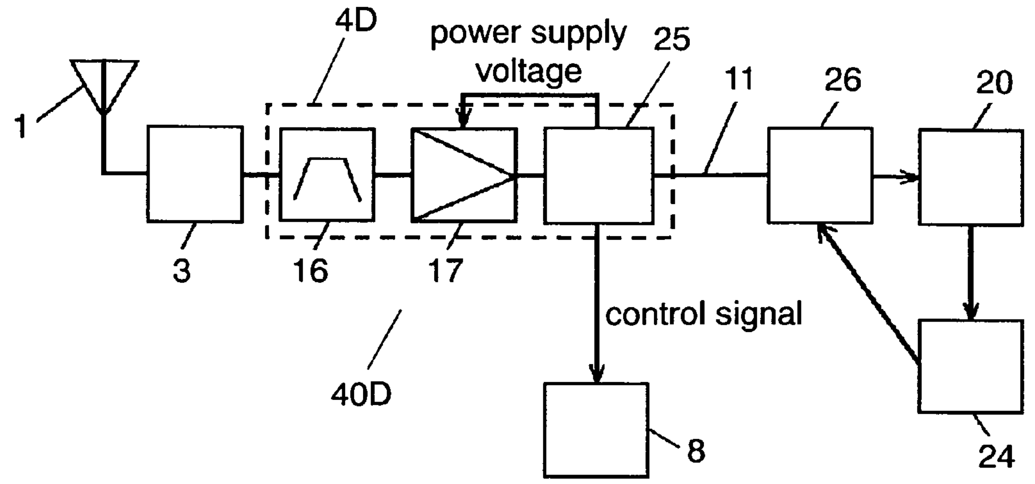
FIG. 30 shows a block diagram of still another structure of the antenna device.

FIG. 30 shows a circuit block diagram in which a control signal for controlling the reactance value of reactance circuit 8 is added on signal line 11.

In FIG. 30, the signal received at antenna element 1 travels through matching circuit 3, filter 16, low-noise amplifier 17, first power supply circuit 25 (hereinafter, circuit 25), signal line 11, second power supply circuit 26 (hereinafter, circuit 26) to demodulator 20. After demodulating the signal by demodulator 20, demodulator 20 requests, as necessary, reactance-value control circuit 24 (hereinafter, circuit 24) to output a signal for controlling the radiation pattern of antenna device 40D. When controlling the radiation pattern is required, a signal for optimizing the radiation pattern fed from circuit 24 is added on power supply voltage entered into amplifier 17 and then transmitted to circuit 26. Filter 16, amplifier 17, and circuit 25 constitute high-frequency circuit 4D.

Figure 31:
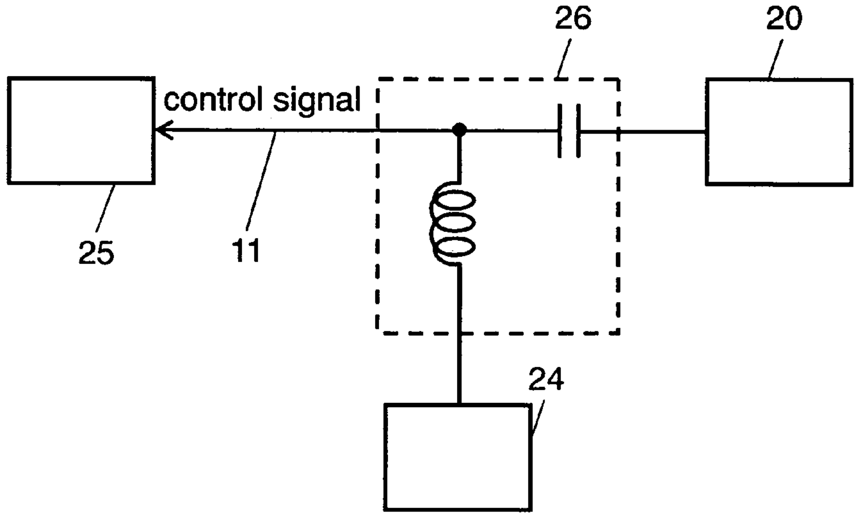
FIG. 31 shows a block diagram of a structure of a second power supply circuit.

FIG. 31 shows a typical circuit structure of second power supply circuit 26. In FIG. 31, the control signal fed from circuit 24 to circuit 26 is not sent to demodulator 20; it is fed to only circuit 25 via signal line 11.

Figure 32:
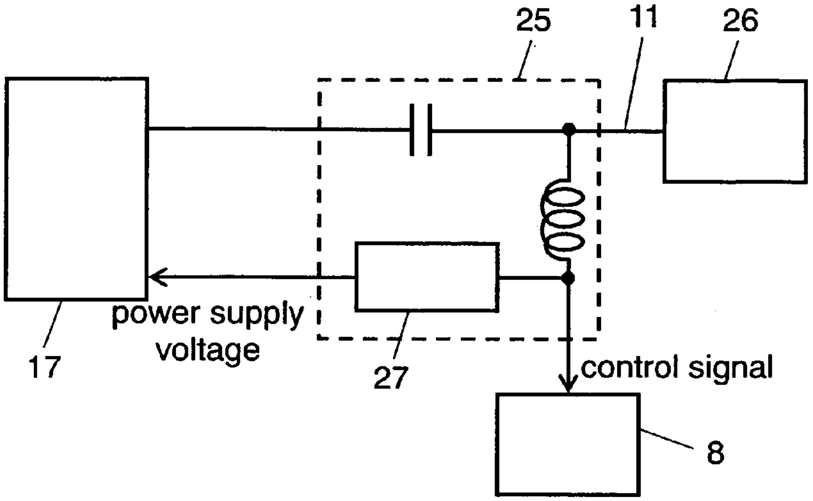
FIG. 32 shows a block diagram of a structure of a first power supply circuit.

FIG. 32 shows a typical circuit structure of first power supply circuit 25. The control signal fed from circuit 26 and the power supply voltage entered into amplifier 17, as shown in FIG. 31, are separately received in circuit 25. The control signal separated by circuit 25 is transmitted to circuit 8 to be used for controlling a reactance value, while the power supply voltage separated by circuit 25 is transmitted to amplifier 17 as the power supply voltage which is passed through regulator 27.

When the control signal for controlling the reactance value of reactance circuit 8 is added on signal line 11, the circuit structure is not limited to those shown in FIGS. 30 through 32.

Although coaxial line 9 is used for a power supply line in the embodiments, it is not limited thereto; the power supply line is not necessarily coaxial line 9 having signal line 11 and shield line 10. For example, a power supply line in which signal line 11 is protected by a metal plate or foil that function as shield line 10 can be employed. Besides, signal line 11 is not necessarily surrounded by shield line 10.

Third Exemplary Embodiment

Figure 33:
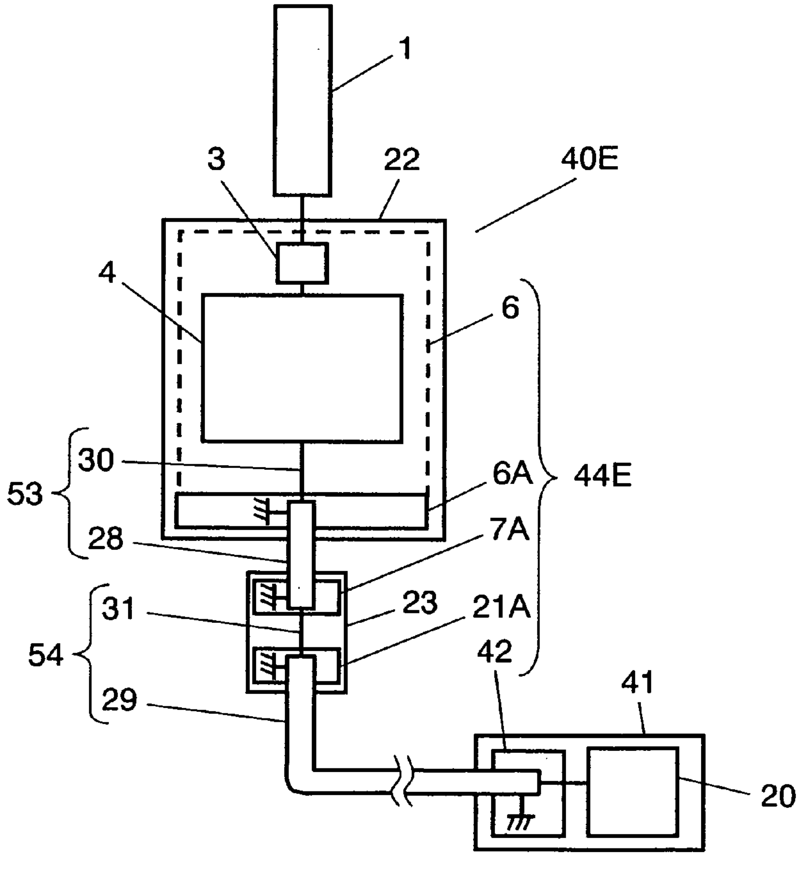
FIG. 33 is a top view illustrating an antenna device of a third exemplary embodiment of the present invention.
Figure 34:
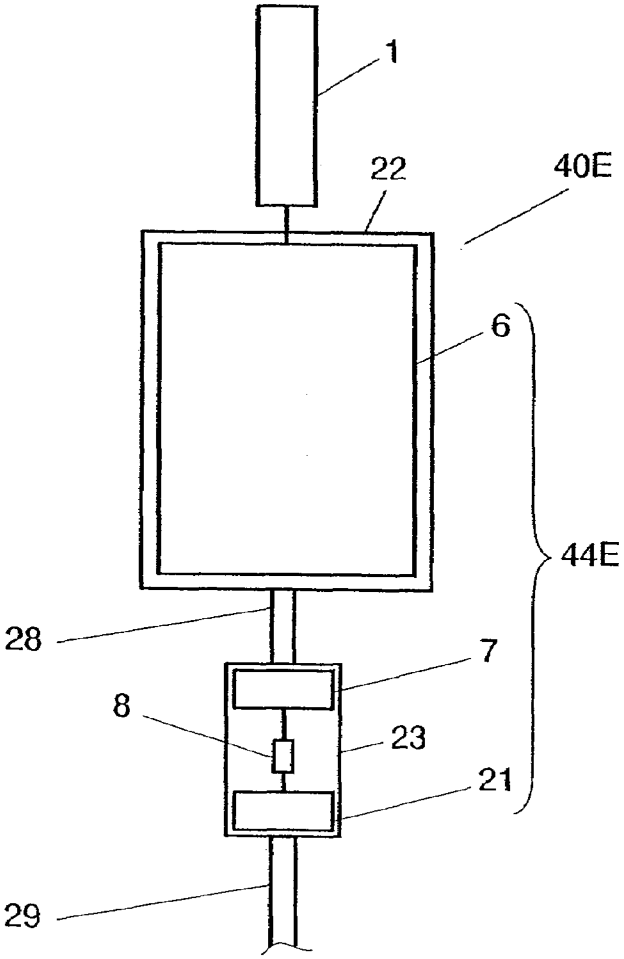
FIG. 34 is a bottom view illustrating the antenna device shown in FIG. 33.
Figure 35:
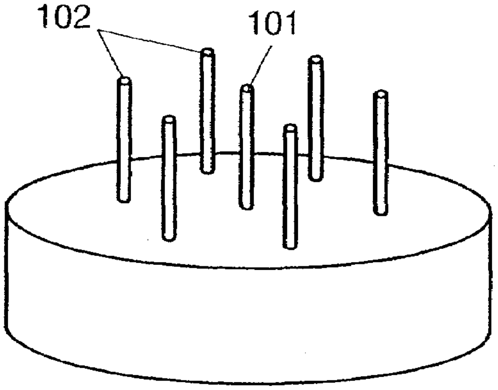
FIG. 35 PRIOR ART
FIG. 35 is a perspective view of a conventional antenna device.
Figure 36:
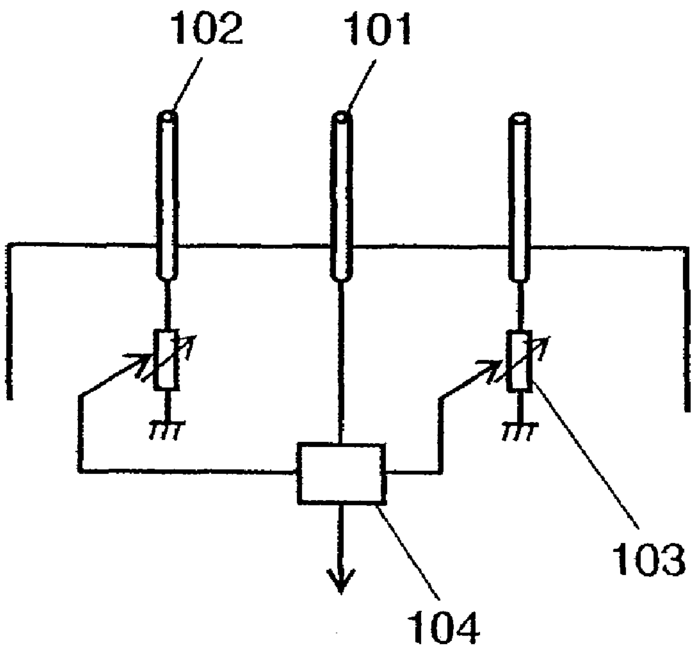
FIG. 36 PRIOR ART
FIG. 36 is a schematic view of a conventional antenna device.

FIG. 33 is a top view of an antenna device of a third exemplary embodiment of the present invention. FIG. 34 is a bottom view of the antenna device shown in FIG. 33. Like parts have similar reference marks as in the structures of the first and the second exemplary embodiments, and the explanation thereof will be omitted.

In FIGS. 33 and 34, first ground section 6 is formed almost over a lower surface of first high-frequency circuit board 22 (hereinafter referred to as board 22). On an upper surface of board 22, fifth ground section 6A (hereinafter, ground 6A) is formed. Ground 6A is short-circuited to ground 6 via a through-hole (not shown) or the like. Matching circuit 3 and high-frequency circuit 4 are formed on the upper surface of board 22 on a back side of ground 6. One end of element 1 is connected to circuit 3. Circuit 3 is connected to circuit 4.

First coaxial line 53 is formed of first shield line 28 (hereinafter, shield line 28) and first signal line 30 (hereinafter, signal line 30) that is covered with shield line 28. Similarly, second coaxial line 54 is formed of second shield line 29 (hereinafter, shield line 29) and second signal line 31 (hereinafter, signal line 31) that is covered with shield line 29. Coaxial line 53 and coaxial line 54 constitute a coaxial line as a power supply line. Shield line 28 and shield line 29 constitute a shield line. Signal line 30 and signal line 31 constitute a signal line.

Ground 6A is connected to an end of shield line 28. The other end of shield line 28 is connected to second ground section 7 that is formed on a lower surface of second high-frequency circuit board 23 (hereinafter, board 23). Board 22 and board 23 constitute a high-frequency circuit board. Third ground section 21 (hereinafter, ground 21) is formed on the lower surface of board 23. Ground 7 is connected to ground 21 via reactance circuit 8 that is disposed on the lower surface of board 23.

On an upper surface of board 23, sixth ground section 7A and seventh ground section 21A (hereinafter, ground 21A) are disposed. Ground 7 is connected to ground 7A via a through-hole (not shown) or the like disposed in board 23. Similarly, ground 21 is connected to ground 21A via a through-hole (not shown) or the like disposed in board 23.

Ground 21A is connected to an end of shield line 29. Signal line 30 is connected to circuit 4. The other end of shield line 29 is connected to fourth ground section 42 that is disposed in transmitter-receiver 41 having demodulator 20 and other components. Grounds 6, 7, 21, 42, 6A, 7A, and 21A, which are the first through seventh ground sections, constitute ground section 44E.

In antenna device 40E described above, each of high-frequency circuit 22 and high-frequency circuit 23 has an individual structure. By virtue of the separated structure, reactance circuit 8 can be properly positioned by selecting the proper length of shield line 28. That is, circuit 8 can be positioned where radiation patterns are easily controlled. As a result, an optimal radiation pattern is easily selected according to an operating environment of antenna device 40E.

The position of circuit 8 effective in controlling the radiation patterns is, for example, the place with a distance of ½ wavelength (as an electrical length) from the feeding point of element 1.

INDUSTRIAL APPLICABILITY

The antenna device of the present invention has a compact structure and easily controls the antenna characteristics, such as radiation characteristics and input impedance characteristics, according to an operating environment. By virtue of the advantage above, the antenna device is suitable for an antenna used for a transmitter-receiver. Using the antenna device allows a transmitter-receiver to have an increased receiving performance.

The invention claimed is:

1. An antenna device, comprising:
an antenna element;
a high-frequency circuit connected to the antenna element;
a substrate having the high-frequency circuit thereon;
a first ground section connected to the high-frequency circuit;
a reactance circuit connected to the first ground section; and
a second ground section connected to the reactance circuit,
wherein both of the first ground section and the second ground section are formed on the substrate
wherein the reactance circuit is positioned so as to have a substantial distance of a length of n times wavelength and a half of wavelength in electrical length; where n takes a positive integer including zero; away from a feeding point of the first ground section or the second ground section.

2. The antenna device of claim 1, further comprising:
a transmitter-receiver; and
a feeder line for connecting between at least any one of the first ground section and the second ground section and the transmitter-receiver.

3. The antenna device of claim 1,
wherein the reactance circuit includes
a plurality of reactance elements and
a switch for switching the reactance elements.

4. The antenna device of claim 1,
wherein the high-frequency circuit includes a receiving power detecting circuit for controlling a reactance value of the reactance circuit.

5. The antenna device of claim 1,
wherein the reactance circuit include a reactance-value control circuit for controlling a reactance value of the reactance circuit.

6. An antenna device, comprising:
an antenna element;
a high-frequency circuit connected to the antenna element;
a first ground section connected to the high-frequency circuit;
a reactance circuit connected to the first ground section;
a second ground section connected to the reactance circuit;
a transmitter-receiver; and
a feeder line for connecting between at least any one of the first ground section and the second ground section and the transmitter-receiver,
wherein the feeder line is a coaxial line including
a signal line, which is connected to the high-frequency circuit, and
a shield line that is disposed so as to surround the signal line and is connected to at least any one of the first ground section and the second ground section.

7. The antenna device of claim 6,
wherein a control signal for controlling a reactance value of the reactance circuit is added on the signal line.

8. An antenna device, comprising:
an antenna element;
a high-frequency circuit connected to the antenna element;
a ground section connected to the high-frequency circuit;
a reactance circuit; and
a coaxial line having
a signal line and
a shield line that is disposed so as to surround the signal line and is connected to the ground section,
wherein, the shield line has
a first shield line and
a second shield line connected to the first shield line via the reactance circuit.

9. The antenna device of claim 8,
wherein the reactance circuit is formed of a parallel circuit of an inductor element and a capacitor element.

10. The antenna device of claim 8,
wherein the reactance circuit includes a variable capacitance diode element.

11. The antenna device of claim 8,
wherein the reactance circuit includes
a plurality of reactance elements and
a switch for switching the reactance elements.

12. The antenna device of claim 8,
wherein the high-frequency circuit includes a receiving power detecting circuit for controlling a reactance value of the reactance circuit.

13. The antenna device of claim 12,
wherein the high-frequency circuit includes an amplifier, and
the receiving power detecting circuit detects receiving power of output from the amplifier.

14. The antenna device of claim 8,
wherein the reactance circuit include a reactance-value control circuit for controlling a reactance value of the reactance circuit.

15. The antenna device of claim 8,
wherein the reactance circuit is positioned so as to have a substantial distance of a length of n times wavelength and a half of wavelength in electrical length; where n takes a positive integer including zero; away from a feeding point of the ground section.

16. The antenna device of claim 8,
wherein a control signal for controlling a reactance value of the reactance circuit is added on the signal line.

17. An antenna device, comprising:
an antenna element;
a high-frequency circuit connected to the antenna element;
a first ground section connected to the high-frequency circuit;
a reactance circuit connected to the first ground section; and
a second ground section connected to the reactance circuit,
wherein the reactance circuit is formed of a parallel circuit of an inductor element and a capacitor element.

18. An antenna device, comprising:
an antenna element;
a high-frequency circuit connected to the antenna element;
a first ground section connected to the high-frequency circuit;

a reactance circuit connected to the first ground section; and a second ground section connected to the reactance circuit, wherein the reactance circuit includes a variable capacitance diode element.

19. An antenna device, comprising:

an antenna element;

a high-frequency circuit connected to the antenna element;

a first ground section connected to the high-frequency circuit;

a reactance circuit connected to the first ground section; and a second ground section connected to the reactance circuit, wherein the high-frequency circuit includes a receiving power detecting circuit for controlling a reactance value of the reactance circuit and an amplifier, and the receiving power detecting circuit detects receiving power of output from the amplifier.

* * * * *